United States Patent [19]
Fujimoto

[11] Patent Number: 5,939,139
[45] Date of Patent: Aug. 17, 1999

[54] METHOD OF REMOVING COATED FILM FROM SUBSTRATE EDGE SURFACE AND APPARATUS FOR REMOVING COATED FILM

[75] Inventor: Akihiro Fujimoto, Kumamoto-ken, Japan

[73] Assignee: Tokyo Electron Limited, Tokyo, Japan

[21] Appl. No.: 09/012,789

[22] Filed: Jan. 23, 1998

[30] Foreign Application Priority Data

Jan. 24, 1997 [JP] Japan ..................................... 9-024510

[51] Int. Cl.$^6$ ............................... B05D 3/12; B05C 11/02
[52] U.S. Cl. ............................... 427/240; 118/52; 118/64; 427/336; 427/385.5; 427/294; 431/231
[58] Field of Search .................................... 427/240, 336, 427/294, 385.5; 437/231; 118/52, 64

[56] References Cited

U.S. PATENT DOCUMENTS

| | | | |
|---|---|---|---|
| 5,658,615 | 8/1997 | Hasebe et al. ......................... | 427/240 |
| 5,688,555 | 11/1997 | Teng ......................................... | 427/240 |
| 5,718,763 | 2/1998 | Tateyama et al. ....................... | 118/52 |

*Primary Examiner*—Janyce Bell
*Attorney, Agent, or Firm*—Oblon, Spivak, McClelland, Maier & Neustadt, P.C.

[57] ABSTRACT

A method of removing a coated film from an edge surface of a substrate comprising the steps of (a) forming an insulating film for protecting a circuit pattern of a substrate by pouring an insulating resin solution on a circuit-pattern formation surface of the substrate, (b) rotating the substrate having the insulating film coated thereon, (c) removing the insulating film by pouring a solvent on the edge surface of the substrate, while the substrate is being rotated, and (d) accelerating dehydration of the insulating film by taking at least one action of spraying a gas to the edge surface of the substrate and performing a local evacuation of a region in the proximity of the edge surface of the substrate while the substrate is being rotated.

18 Claims, 4 Drawing Sheets

METHOD OF REMOVING COATED FILM FROM SUBSTRATE EDGE SURFACE AND APPARATUS FOR REMOVING COATED FILM

BACKGROUND OF THE INVENTION

The present invention relates to a method of removing film such as a polyimide resin film (provided for protecting a circuit pattern formed on a substrate, e.g., a semiconductor wafer) coated on a substrate from a substrate edge surface, and also relates to an apparatus for removing the coated film.

In a photolithographic process for a semiconductor device, a desired pattern circuit is usually formed by the steps of coating a photoresist over a semiconductor wafer, subjecting the coated resist film to a pattern-exposure process, followed by performing dry-etching using the resist film thus patterned as a mask. Finally, a resin such as polyimide is coated on the desired pattern circuit to form an insulating layer for protecting the circuit. In this manner, a preparatory step of manufacturing a semiconductor device, namely, a wafer formation step, is completed.

The insulating protecting layer is formed by use of a spin coater in the same way as in the resist coating. When the spin coater is used, a coating solution is supplied to the center of the wafer while the wafer is being rotated. The coating solution is therefore dispersed and spread over the entire wafer surface by virtue of centrifugal force. The resultant film can be obtained in a uniform thickness.

However, the wafer coating method with the polyimide resin by use of the spin coater has the following two problems. First, a resin solution is partially attached to a circumference edge surface $9d$ of and a rear surface $9c$ in the vicinity of $9d$ of the wafer, as shown in FIG. 2. Since the viscosity of the polyimide resin solution is so high that it is difficult to separate it centrifugally from the wafer. Second, with the passage of time after coating, the film formed on the wafer edge surface 9 becomes thicker than that formed on the other portion by the influence of surface tension and the like. When the film 30*a* coated on the wafer edge surface 9 presents the state as shown in FIG. 2, an arm holder for use in transferring the wafer adheres the coated film 30*a* still wet. If so, when the wafer is removed from the arm holder, the wafer jumps up, resulting in miss-positioning (transfer error). When the polyimide resin solution attached to the arm holder is dried, it changes into particles. The particles are scattered around the holder and attach to the wafer.

To remove the coated film 30*a* from the wafer edge surface 9, side-rinse is applied to the coated film 30*a* by supplying a solvent from a nozzle while the wafer is being rotated in the same manner as in coating a posi-resist. Thereafter, the coated film 30*a* is centrifugally shaken off with the help of vacuum and blow, and dried.

However, a solvent contained in the polyimide resin solution is difficult to vaporize, it therefore takes a long time to dry the coated film completely at room temperature. Hence, when the coated film 30 is removed from the wafer edge surface 9 by pouring the solvent to a half-dried coated film 30*a*, the polyimide resin solution partly flows out from the half-dried coated film 30*a* during the side-rinse/shaking-off step and attached on the wafer edge surface 9 (coated film removed portion). As a result, the same problems as mentioned above such as the transfer error and particle contamination may be arisen.

It may be possible to employ an arm holder of a vacuum-absorption type to avoid the transfer error. However, the vacuum-absorption type arm holder is complicated in structure, so that it is unpreferable in view of particle reduction.

BRIEF SUMMARY OF THE INVENTION

An object of the present invention is to provide a method for removing a coated film from an edge surface of a substrate, which is capable of removing the coated film from the edge surface of the substrate including peripheral portions of upper and lower surfaces, a circumference surface, and a bevel surface, and also provide an apparatus for removing the coated film.

The method for removing film from the edge surface of a substrate according to the present invention comprises the steps of:

(a) forming an insulating film for protecting a circuit pattern on the substrate by pouring an insulating resin solution on a circuit-pattern formation surface of the substrate;

(b) rotating the substrate having the insulating film coated thereon;

(c) removing the insulating film by pouring a solvent on the edge surface of the substrate, while the substrate is being rotated; and (d) accelerating dehydration of the insulating film by taking at least one action selected from the group consisting of spraying gas to the edge surface of the substrate and performing a local evacuation of a region in the proximity of the edge surface of the substrate, while the substrate is being rotated.

In the step (d), it is preferable that the local evacuation of a region in proximity of the edge surface of the substrate is performed while gas is being sprayed directly onto the edge surface of the substrate.

In the step (b), it is preferable that the substrate be rotated at a speed within the range of 10 to 1000 rpm.

As the solvent to be used in the step (c), it is preferred to use a solution mixture of isopropyl alcohol and either normal mehtylpyrrodinone or methyl methoxypropionate.

In the step (d), it is desired to spray the gas on the edge surface of the substrate along the radius of the substrate from a center to a periphery of the substrate.

In the step (d), it is desired to supply the solvent in a direction perpendicular to the circuit-pattern formation surface of the substrate.

In the step (d), it is desired to spray the gas in substantially the parallel direction to that of the solvent is supplied;

In the step (d), it is preferred to increase the intensity of the gas spray stepwise.

In the step (d), the gas spray is preferably initiated after the solvent supply is initiated.

In the step (d), the gas spray is preferably terminated after the solvent supply is terminated.

The apparatus for removing a coated film from an edge surface of a substrate, comprising:

a spin chuck for holding and rotating a substrate having a circuit-pattern formation region coated with film made of an insulating resin;

a nozzle for a solvent for melting and removing the film from the edge surface of the substrate by pouring the solvent on the edge surface of the substrate on the spin chuck; and dehydration accelerating means for accelerating dehydration of the film by generating a gas flow in an ambient atmosphere surrounding the edge surface of the substrate on the spin chuck. The gas flow is generated by the dehydration accelerating means in the ambient atmosphere surrounding the edge surface of the substrate while the solvent is being poured onto the edge surface of the substrate from the solvent nozzle.

The apparatus is further preferred to have controllers for controlling a rotation speed of the spin chuck, a solvent supply amount from the solvent nozzle, and the gas flow formed by the dehydration accelerating means.

The dehydration accelerating means preferably has at least one selected from the group consisting of a gas nozzle for spraying the gas to the edge surface of the substrate and a sucking nozzle for evacuating an ambient gas surrounding the edge surface of the substrate.

It is further preferable that the apparatus comprise nozzle moving means for moving the gas nozzle to align the gas nozzle with the edge surface of the substrate.

It is further preferable that the apparatus comprise a coating-solution supply nozzle for coating an insulating resin solution on the circuit-pattern formation surface in order to form an insulating film for protecting the circuit-pattern formation surface on the substrate.

In the present invention, since the coated film is accelerated to dry by spraying gas onto the edge surface of the substrate and by sucking the ambient atmosphere in the proximity of the edge surface of the substrate, the substrate can be rotated at a lower speed than that employed in a conventional apparatus. Therefore, the flowing-out of the coated film toward the edge surface of the substrate due to centrifugal force (the flowing-out occurs even if a difficult-to-dry resin, such as polyimide, is used) can be prevented. As a result, the substrate edge surface can be kept clean.

It should be noted in a conventional method that when a wafer W of 8-inch diameter is used as the substrate, a solvent is supplied to the substrate edge surface while the substrate is being rotated at a speed as high as 500 rpm, a coated film such as a polyimide film receives a large centrifugal force before it dries. As a result, the polyimide film is broken and flows out to the film removing region to contaminate it.

In contrast, in the present invention, since the film is dried simultaneously with removing the film, the rotation speed of the substrate can be reduced. The film therefore does not receive a large centrifugal force before it dries. Consequently, the film is not broken and no contamination occurs.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, preferable embodiments of the present invention will be explained with respect to the accompanying drawings.

Figure 1:
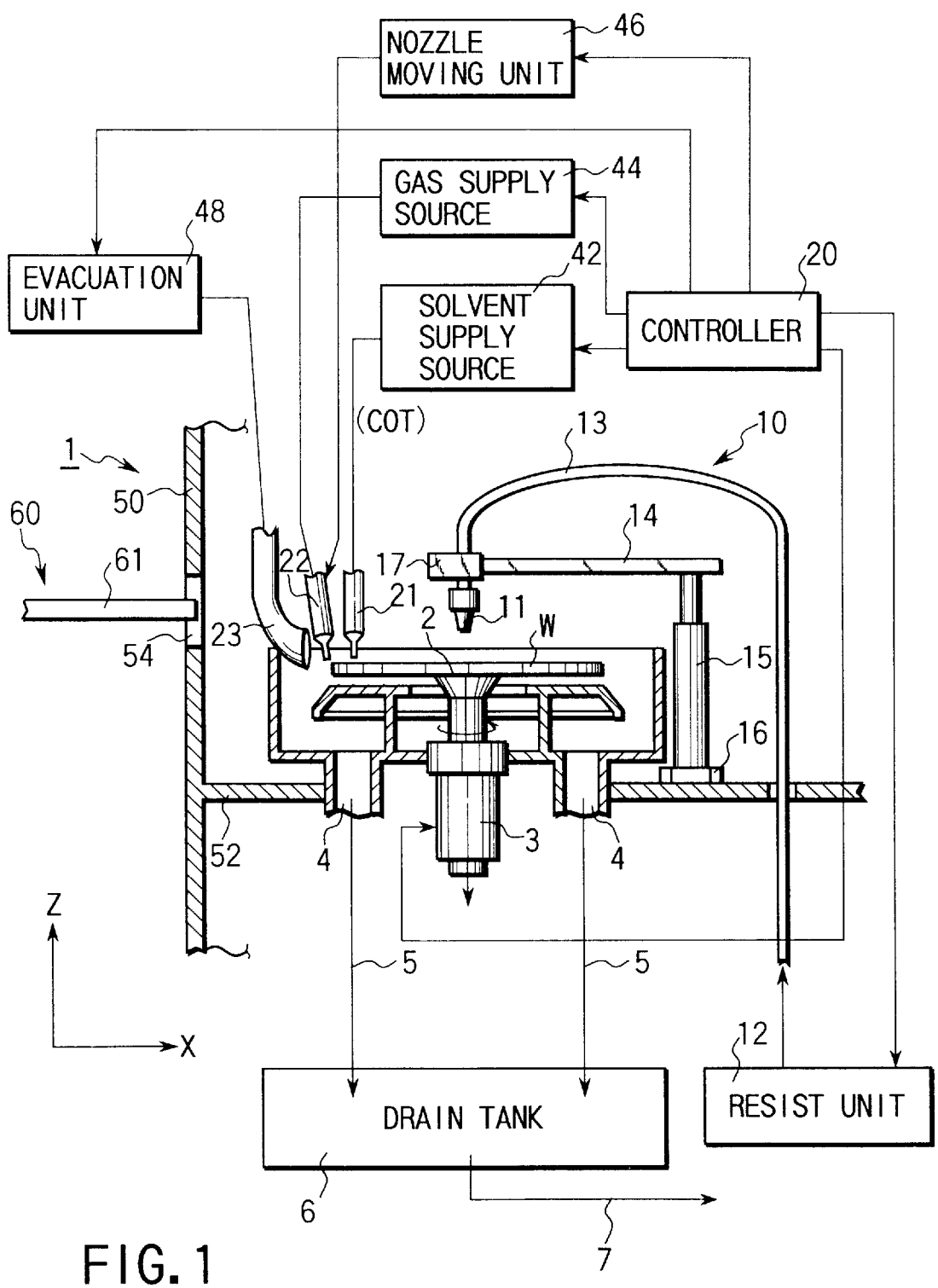
FIG. 1 is a block diagram of a coated film removing apparatus from a substrate edge surface according to an embodiment of the present invention.

As shown in FIG. 1, a coating unit (COT) 1 comprises a spin chuck 2 for holding a semiconductor wafer W almost horizontally by absorption force, a cup 8 surrounding a wafer W mounted on the spin chuck 2 for receiving a solution centrifugally separated from the wafer W and discharge it. A casing 50 of the coating unit (COT) 1 has a side opening 54. An arm holder 61 of a transfer arm mechanism 60 is loaded/unloaded to/from the coating unit (COT) 1 through the opening 54. A lower portion of the spin chuck 2 is connected to a rotation-driving axis of a pulse motor 3. The power source of the pulse motor 3 is controlled by a controller 20.

The inside of the cup 8 is evacuated by an evacuation means (not shown) via a center of the bottom by way of the inside of the pulse motor 3. A plurality of discharge ports 4 are formed in the bottom of the cup 8. Each of the discharge ports 4 is connected to a drain tank 6 by way of a drain passage 5. Furthermore, the drain tank 6 is connected to a tank (not shown) set in a factory by way of a line 7. The discharge solution is discharged outside the unit (COT). The cup 8 has an upper opening. The wafer W is mounted on the spin chuck 52 by the transfer arm mechanism 60 through the upper opening. Note that the upper opening of the cup 8 is designed to be covered with a closable cover (not shown).

A first nozzle 11 is detachably provided at a free end portion of a horizontal arm 14 by means of a holder 17. The base end portion of the horizontal arm 14 is supported by a nozzle operation mechanism 15. The nozzle operation mechanism 15 has an X-axis moving mechanism, Y-axis moving mechanism, and Z-axis moving mechanism (all are not shown). A Y-axis guide rail 16 is formed on a unit bottom plate 52. The nozzle operation mechanism 15 is movable in the Y-axis direction along the rail 16 by the Y-axis moving mechanism. A first nozzle 11 is vertically movable together with the arm 14 by the Z-axis moving mechanism. The nozzle 11 is further movable in the X-axis direction by the X-axis moving mechanism.

Note that a nozzle stand-by position (not shown) is provided next to the cup 8 in the coating unit (COT) 1. The nozzle stand-by position is a place in which the first nozzle 11 not in operation is standing by for the operation. In the stand-by position, the solution discharge port of the first nozzle 11 is inserted in a solvent atmosphere chamber. The nozzle holder 17 houses a temperature controller (not shown) which controls a coating solution discharged from the first nozzle 11 at a constant temperature.

An edge surface cleaning mechanism 25 is provided in the proximity of the edge surface 9 of the wafer W. The edge surface cleaning mechanism 25 comprises a second nozzle 21, a third nozzle 22 and a sucking nozzle 23 for evacuation. The second nozzle 21 is connected to a solvent supply source 42 and works for discharging a solvent toward the edge surface 9 of the wafer W. The solvent supply source 42 contains solvents such as isopropyl alcohol and either normal methylpyrrodinone or methyl methoxypropionate. The third nozzle 22 is connected to a gas supply source 44 and used for spraying gas to the edge surface 9 of the wafer W. The gas supply source 44 contains an inert gas such as a nitrogen gas or an argon gas. The third nozzle 22 is movably supported by an arm (not shown) of a nozzle moving mechanism 46. Note that dry air may be supplied to the third nozzle 22 instead of the inert gas. The tips of discharge ports of the second and third nozzles 22, 23 are made thinner. For example, the inner diameters of the second and third nozzles 22, 23 are 0.5 mm and 1.0 mm, respectively. Since such a thin-tip nozzles thus constructed are employed, the solvent and gas can be sprayed out vigorously, increasing film-removing ability and a cleaning ability.

The suction nozzle 23 for evacuation is connected to a suction side of an evacuation apparatus 48, so that the region near the edge surface 9 of the wafer W is widely evacuated. The suction port of the evacuation suction nozzle 23 is sufficiently wide to cover the wafer edge surface 9 including the rear surface 9c.

The third nozzle 22 and the suction nozzle 23 for evacuation serve as a dehydration accelerating means for coated films 30a and 30 when a solvent (coated film removing solution) is poured. For example, dry air or dry nitrogen gas is supplied from the third nozzle 22. The third nozzle 22 and the suction nozzle 23 for evaluation may be used either simultaneously or non-simultaneously.

Now, we will explain how to remove the coated film from the wafer edge surface with reference to FIGS. 7 and 8A to 8C.

Figure 2:
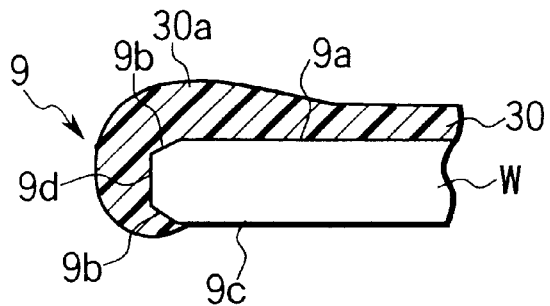
FIG. 2 is a magnified view of a substrate edge surface coated with a film.
Figure 3:
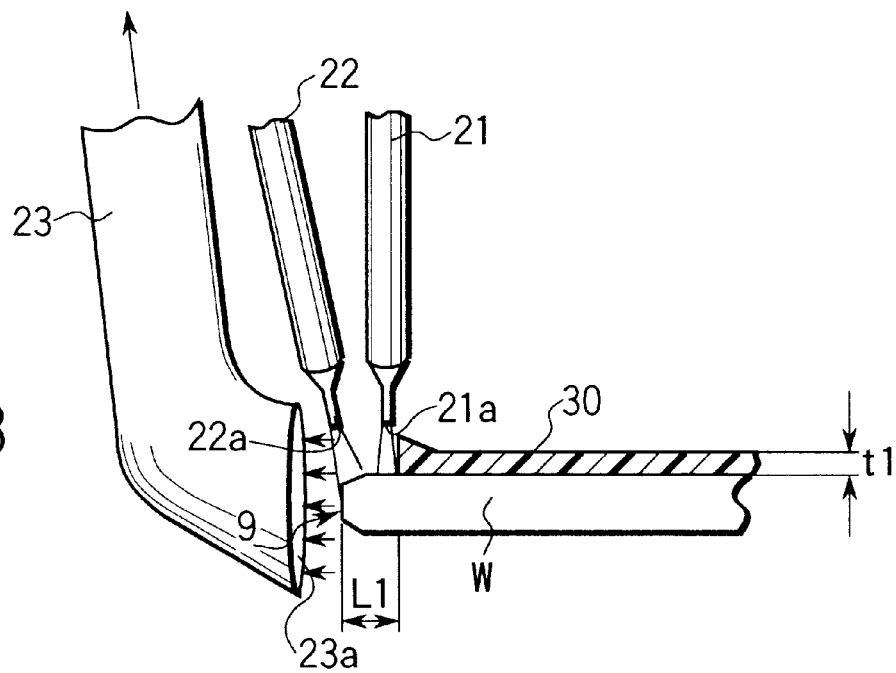
FIG. 3 is a magnified and simplified view of a substrate edge surface and a coated film removing apparatus when the coated film is removed.

After formation of a predetermined circuit pattern on the wafer surface is completed, the wafer W is transferred to the coating unit by the transfer arm mechanism 60. The wafer W is inserted together with the holder 61 of the arm mechanism 60 into the coating unit via the loading/unloading port 54 and mounted on the spin chuck 2 (Step S1). While the wafer held on the spin chuck by absorption is being rotated at a predetermined speed, a predetermined amount of the polyimide resin solution is poured dropwise from the first nozzle 11. In this manner, the solution is spread over the entire surface of the wafer W to form an insulation protection film 30 (Step. S2). The thickness t1 of the insulating protecting film 30 thus formed is almost uniform within the range of 3 to 10 $\mu$m except the wafer edge surface 9. However, the insulating protecting film 30a is formed thicker on the wafer edge surface 9 than that of other portion, as shown in FIG. 2, since the polyimide resin solution is highly viscous. The "wafer edge surface" used herein includes a peripheral portion 9a of the pattern formation surface of the substrate W, a bevel surface 9b, a peripheral portion 9c of the rear surface, and a circumference edge surface 9d.

Figure 8A:
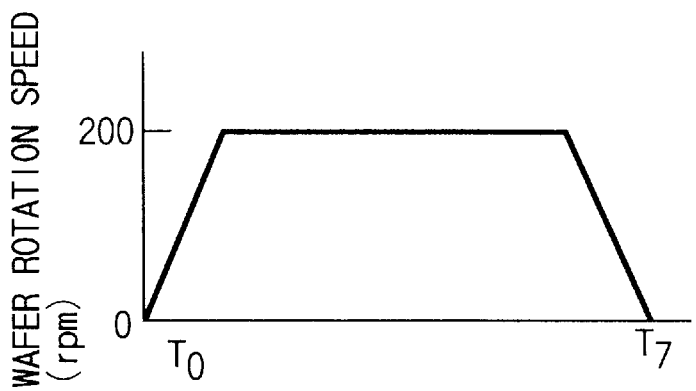
FIGS. 8A, 8B and 8C show timing-charts with respect to substrate rotation speed, solvent discharge amount, and gas spray amount employed for removing the coated film from the substrate edge surface, respectively.
Figure 8B:
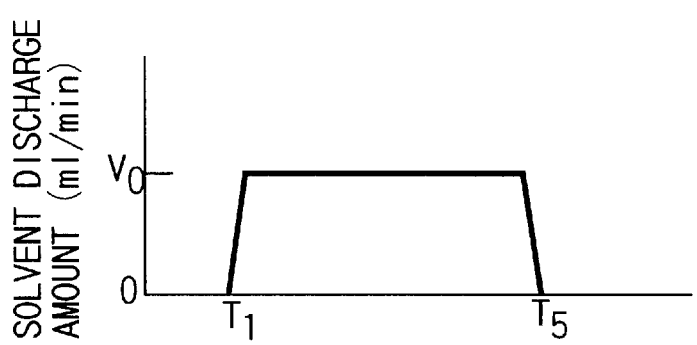
Figure 8C:
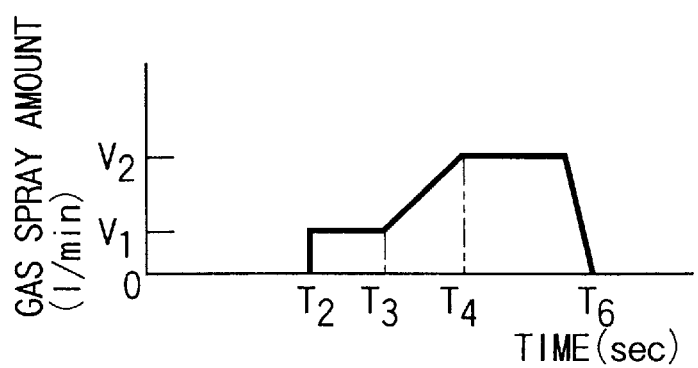

The controller 20 controls the operation of the nozzle moving apparatus 46 to determine a position and a direction of the nozzle 22 relative to the substrate (Step, S3). Rotation of the wafer W is initiated at a time point $T_0$ as shown in FIG. 8A (Step S4). At a time point $T_1$ after the rotation speed of the wafer W reaches constant at a normal speed of 200 rpm, solvent supply from the second nozzle 21 to the wafer edge surface 9 is initiated in an amount $V_0$ (ml/min) as shown in FIG. 8B (Step 5). Subsequently, spray gas supply from the third nozzle 22 is initiated at a time point $T_2$. The supply amount is kept at $V_1$ from a time point $T_2$ to a time point $T_3$, so that the intensity of the sprayed gas is weak as shown in FIG. 8C (Step S6). At a time point $T_3$, opening degree of a valve of a flow-rate controller is switched in such a way that the supply rate of the gas from the third nozzle 22 increases from $V_1$ to $V_2$. The gas is supplied in an amount of $V_2$ from time $T_4$ to time $T_6$ (Step, S7). The supply of the solvent from the second nozzle 21 is terminated at a time point $T_5$ (Step S8). As mentioned above, it is preferable that the spray amount of the gas be initially low and increased with the passage of dehydration. Note that the supply rate of the gas is controlled in two step, however, a plurality steps of supply rates (3 or more) may be used. By virtue of this, it is possible to efficiently prevent attachment of particles and droplets onto the edge surface 9 (coated film removing region) of the wafer W.

It is preferable that the region in the proximity of the wafer edge surface 9 be continuously evacuated by suction using the evacuation nozzle 23 at least in a time period from time $T_1$ to time $T_6$ (S5 to S9). If so, the vaporized solvent will not stay in the proximity of the wafer edge surface 9, with the result that the dehydration of the film removal region (particularly the peripheral portion 9a of the pattern formation region) is accelerated to obtain a clean surface. The particles and droplets are efficiently and increasingly prevented from attaching to the surface.

At time $T_6$, the gas spray from the third nozzle 22 is terminated (Step S9). Then, at a time point $T_7$, the rotation of the wafer W is terminated (Step S10). Thereafter, the transfer arm mechanism 60 accesses the coating unit. The wafer W is picked up from the spin chuck 2 by the holder 61 and unloaded from the coating unit (Step S11).

According to the aforementioned embodiment, the dehydration of the polyimide resin is accelerated by the gas sprayed from the third nozzle 22 and by sucking air through the suction nozzle 23 for evacuation. Therefore, the rotation speed of the wafer may be reduced to as low as, for example, 1000 rpm or less. The film 30 can be dried even if the wafer is rotated at a lower speed than a conventionally-employed 1500 rpm. As a result, reattachment of the removed film to the edge surface 9 of the wafer W due to the centrifugal force can be prevented.

As the wafer rotation speed, its upper limit is preferably set at 1000 rpm to prevent reattachment of droplets onto the rear surface 9c of the edge surface 9. On the other hand, it is preferred to set the lower limit at 10 rpm. This is because if the rotation speed of the wafer W is excessively lower, the film 30a melted with the solvent is not efficiently shaken off.

As the solvent supplied from the second nozzle 21, normal methylpyrrodinone (NMP), methyl methoxypropionate (MMP), and isopropyl alcohol (IPA) may be appropriately used. To accelerate the dehydration of the film 30, IPA is preferred to be used together with either NMP or MMP.

Figure 4:
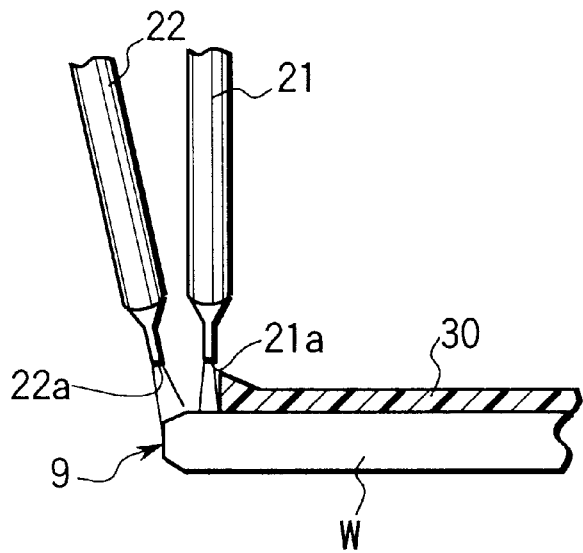
FIG. 4 is a magnified and simplified view of a substrate edge and a coated film-removing apparatus when the coated film is removed according to another embodiment.
Figure 5:
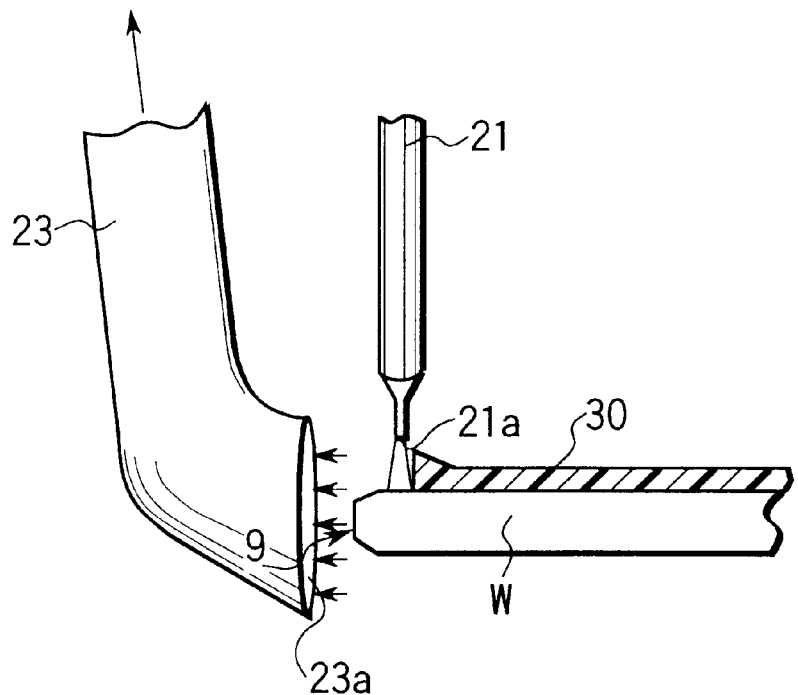
FIG. 5 is a magnified and simplified view of a substrate edge and a coated film-removing apparatus when the coated film is removed according to still another embodiment.
Figure 6:
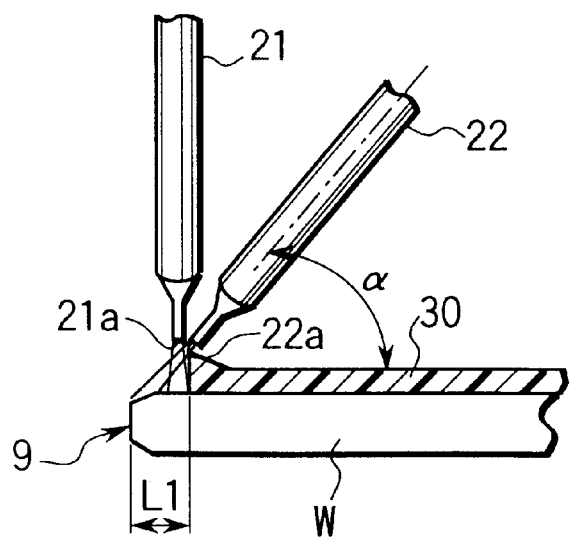
FIG. 6 is a magnified and simplified view of a substrate edge and a coated film-removing apparatus when the coated film is removed according to a further embodiment.
Figure 7:
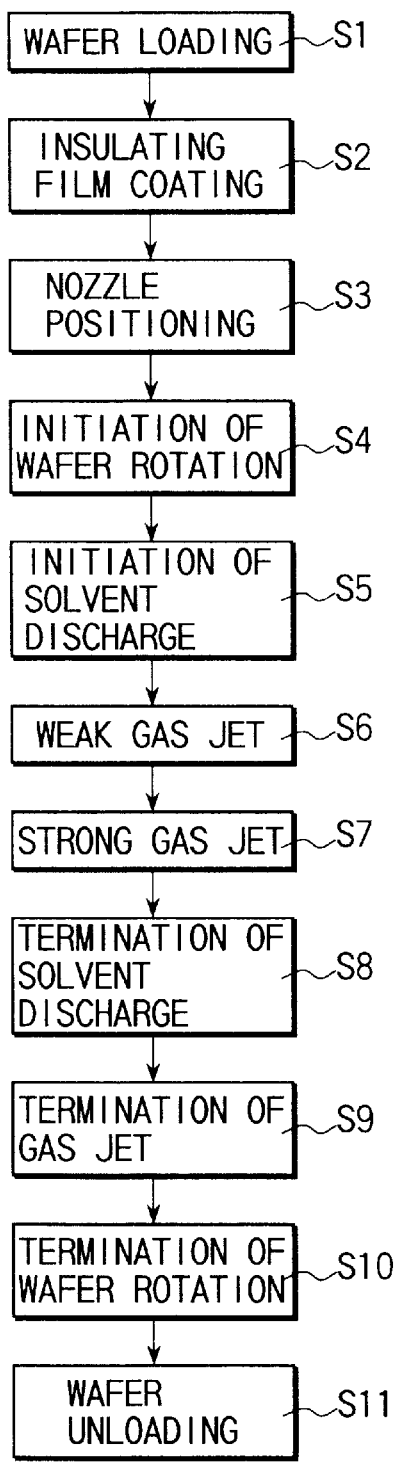
FIG. 7 is a flow-chart showing the steps of removing film coated on the substrate edge surface according to an embodiment of the present invention.

The present invention is not limited to the aforementioned embodiments and may be modified in various ways. For example, as the dehydration accelerating means, the gas nozzle 22 may be provided alone as shown in FIG. 4. Alternatively, the suction nozzle 23 for evacuation may be provided alone as shown in FIG. 5. In the aforementioned embodiment, the gas is sprayed from the nozzle 22 to the wafer W in the direction from the periphery to the center along the radius. However, the gas nozzle 22 may be diagonally provided as shown in FIG. 6 where the axis of the nozzle 22 is set at an angle α with the film 30 of the wafer W. In this case, the gas from the nozzle 22 is sprayed outwardly from the center of the wafer W. If the latter case is employed, particles and droplets are leaving from the wafer. Therefore, they may not attach onto the wafer W.

As the spray gas for use in dehydration, dry air may be used other than a dry-state inert gas such as a nitrogen gas, an argon gas, or a carbon dioxide gas.

The gas to be used herein is desirably set at room temperature. However, to accelerate the dehydration of the film, the temperature may be set at a temperature slightly higher than room temperature within the range of 30 to 40° C. When a hot gas is used, the temperature of the hot gas may not exceed 100° C., desirably.

In the aforementioned embodiment, a difficult-to dry polyimide resin is used as the coating solution. Other coating solution such as a photoresist is applicable in the present invention. It should be noted that the present invention is particularly advantageous if a difficult-to-dry resin such as the polyimide resin is used. Furthermore, a semiconductor wafer is used as a substrate in the aforementioned embodiments. However, the present invention is not limited to the semiconductor wafer, and a substrate for a liquid crystal display or the like may be used.

According to the present invention, since the dehydration is accelerated by sucking the gas from the proximity of the substrate edge surface while the solvent is being poured on it, as explained above, the rotation speed of the substrate can be reduced. On the other hand, it is possible to prevent reattachment of the removed resin film due to centrifugal force even if the polyimide resin (difficult to dry) is used. Hence, the edge surface of the substrate can be efficiently cleaned. If the rotation speed of the substrate falls within the range of 10 to 1000 rpm, the reattachment of the removed film to the edge surface and the rear surface in the vicinity thereof due to the centrifugal force can be efficiently prevented. Furthermore, IPA is used in combination with either NMP or MMP as the cleaning solution, the coated film can be more efficiently removed from the substrate edge surface.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. A method of removing a coated film from a peripheral region of a substrate comprising the steps of:

(a) forming an insulating film for protecting a circuit pattern of a substrate by pouring an insulating resin solution on a circuit-pattern formation surface of the substrate;

(b) rotating the substrate having the insulation film coated thereon;

(c) removing the insulating film by pouring a solvent on the region of the substrate, while said substrate is being rotated; and (d) accelerating dehydration of the insulating film by taking at least one action selected from the group consisting of supplying a gas to a border region between a region having the coating film thereon and a region having no coating film thereon and performing local evacuation of a region in proximity to the peripheral region of the substrate, while the substrate is being rotated.

2. The method according to claim 1, wherein, in said step (d), the local evacuation of a region in proximity of the peripheral region of the substrate is performed while gas is being supplied to the border region.

3. The method according to claim 1, wherein, in said step (b), the substrate is rotated at a speed within the range of 10 to 1000 rpm.

4. The method according to claim 1, wherein, as the solvent to be used in said step (c), a solution mixture of isopropyl alcohol and either normal methylpyrrodinone or methyl methoxypropionate, is used.

5. The method according to claim 1, wherein, in said step (d), the gas is being supplied onto the border region along the radius of the substrate in a direction from a center to a periphery of the substrate.

6. The method according to claim 1, wherein, in said step (d), the solvent is supplied in a direction perpendicular to the circuit-pattern formation surface of the substrate.

7. The method according to claim 6, wherein, in said step (d), gas is supplied in substantially a parallel direction to that in which the solvent is supplied.

8. The method according to claim 1, wherein in said step (d), the intensity of the gas supply is increased stepwise.

9. The method according to claim 1, wherein, in said step (d), the gas supply is initiated after the solvent supply is initiated.

10. The method according to claim 1, wherein, in said step (d), the gas supply is terminated after the solvent supply is terminated.

11. The method according to claim 1, wherein, in the step (d), a dry gas of room temperature is supplied onto the border region.

12. The method according to claim 1, wherein, in said step (d), a heated dry gas is supplied onto the border region.

13. The method according to claim 1, wherein said insulating resin solution is a solution containing polyimide resin dissolved in a solvent.

14. An apparatus for removing a coated film from a peripheral region of the substrate, comprising:

- a spin chuck for holding and rotating a substrate having a circuit-pattern formation region coated with film made of an insulating region;
- a nozzle for supplying a solvent for melting and removing the film from the peripheral region of the substrate by pouring a solvent on the peripheral region of the substrate on the spin chuck; and
- dehydration accelerating means for accelerating dehydration of the film by generating a gas flow in an ambient atmosphere surrounding the peripheral region of the substrate on the spin chuck; said gas flow being generated by the dehydration accelerating means in the ambient atmosphere surrounding the peripheral region of the substrate while the solvent is being poured onto the peripheral region of the substrate from the solvent nozzle.

15. The apparatus according to claim 14, further comprising controllers for controlling a rotation speed of the spin chuck, a solvent supply amount from the solvent nozzle, and the gas flow formed by the dehydration accelerating means.

16. The apparatus according to claim 14, wherein said dehydration accelerating means has at least one selected from the group consisting of a gas nozzle for supplying the gas to the a border region between a region having the coating film thereon and a region having no coating film thereon and a sucking nozzle for evacuating an ambient gas surrounding the peripheral region of the substrate.

17. The apparatus according to claim 16, further comprising nozzle moving means for moving the gas nozzle to align the gas nozzle with the border region of the substrate.

18. The apparatus according to claim 14, further comprising a coating solution supply nozzle for coating an insulating resin solution on the circuit-pattern formation surface in order to form an insulating film for protecting the circuit-pattern formation surface of the substrate.

* * * * *